US006645793B2

(12) United States Patent
Fujii et al.

(10) Patent No.: US 6,645,793 B2
(45) Date of Patent: Nov. 11, 2003

(54) MANUFACTURING METHOD AND MANUFACTURING DEVICE OF MICROSTRUCTURE

(75) Inventors: Eiichi Fujii, Suwa (JP); Kimio Nagasaka, Suwa (JP)

(73) Assignee: Seiko Epson Corporation (JP)

(*) Notice: Subject to any disclaimer, the term of this patent is extended or adjusted under 35 U.S.C. 154(b) by 29 days.

(21) Appl. No.: 09/956,490

(22) Filed: Sep. 19, 2001

(65) Prior Publication Data
US 2002/0048833 A1 Apr. 25, 2002

(30) Foreign Application Priority Data

Sep. 20, 2000 (JP) ......................................... 2000-284988

(51) Int. Cl.[7] ........................... H01L 21/44; B29C 39/10
(52) U.S. Cl. ........................... 438/127; 438/51; 438/55; 438/64; 438/124; 264/259
(58) Field of Search ............................... 438/51, 55, 64, 438/124, 127; 264/259, 299, 330

(56) References Cited

U.S. PATENT DOCUMENTS

| 4,264,551 A | * | 4/1981 | Oonishi et al. ............... 264/107 |
| 4,788,015 A | * | 11/1988 | Sakai et al. ................... 264/1.33 |
| 5,120,678 A | * | 6/1992 | Moore et al. ................... 29/840 |
| 5,203,076 A | * | 4/1993 | Banerji et al. ................... 29/840 |
| 5,532,187 A | * | 7/1996 | Schreiber-Prillwitz et al. ... 438/51 |
| 5,659,203 A | * | 8/1997 | Call et al. ..................... 257/778 |
| 5,804,881 A | * | 9/1998 | Wille et al. ................... 257/780 |
| 5,821,456 A | * | 10/1998 | Wille et al. ................... 174/52.2 |
| 5,866,950 A | * | 2/1999 | Iwasaki et al. ............... 257/782 |
| 5,930,598 A | * | 7/1999 | Wille et al. ................... 438/108 |
| 6,083,819 A | * | 7/2000 | Wille et al. ................... 438/612 |
| 6,143,412 A | * | 11/2000 | Schueller et al. ............. 428/408 |
| 6,355,198 B1 | * | 3/2002 | Kim et al. ..................... 264/259 |
| 6,373,142 B1 | * | 4/2002 | Hoang ........................... 257/783 |
| 6,398,992 B1 | * | 6/2002 | Jacobson ..................... 264/37.1 |

FOREIGN PATENT DOCUMENTS

WO          97/33737          9/1997

OTHER PUBLICATIONS

Kim et al., "Micromolding in Capillaries: Applications in Materials Science", J. Am. Chem. Soc. 1996, 118, pp. 5722–5731.

* cited by examiner

*Primary Examiner*—Caridad Everhart
*Assistant Examiner*—Lex H. Malsawma
(74) *Attorney, Agent, or Firm*—Harness, Dickey & Pierce, P.L.C.

(57) ABSTRACT

Provided is a manufacturing method and manufacturing device of a microstructure capable of forming resin patterns on a substrate without any "offset portion". A substrate 50 and a stamper 30 to which a concave/convex pattern is formed are aligned so as to be flush; resin 60 is infiltrated from one end side of the stamper 30 to the aligned face of the substrate 50 and stamper 30, and the resin 60 is drawn into the concave/convex pattern of the stamper 30 by setting the barometric pressure of the other end side of the stamper 30 to be relatively lower than the one end side of the stamper 30; resin 60 that spread in the concave/convex pattern of the stamper 30 is cured; and a resin 60 pattern transferred from the stamper 30 is obtained on the substrate 50 by separating the substrate 50 and stamper 30.

18 Claims, 8 Drawing Sheets

MANUFACTURING METHOD AND MANUFACTURING DEVICE OF MICROSTRUCTURE

BACKGROUND OF THE INVENTION

1. Field of the Invention

The present invention generally relates to optical elements such as diffraction grating, liquid crystal display devices, and microstructure processing technology (micromolding) of semiconductors and the like, and particularly to the manufacturing method and manufacturing device of microstructures with fine resin patterns on the substrate.

2. Description of the Related Art

The 2P method and other methods are conventionally known as methods for forming a thin film resin pattern on a substrate In other words, resin is applied on the substrate, and a stamper with slants and steps on the surface thereof is pressed against the resin in order to cure the resin. Thereafter, a resin pattern is formed on the substrate by removing the stamper.

Figure 5:
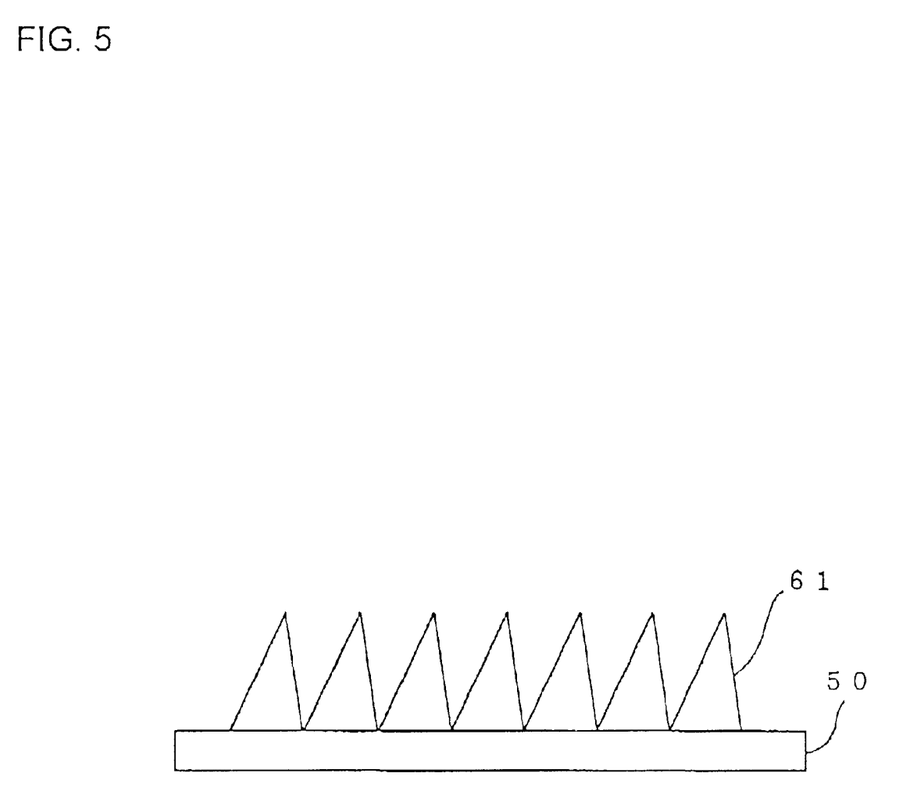
FIG. 5 is an explanatory diagram explaining an example (in the shape of a saw blade cross section) of a diffraction grating without any "offset portion" manufactured on the substrate pursuant to the present invention.
Figure 6:
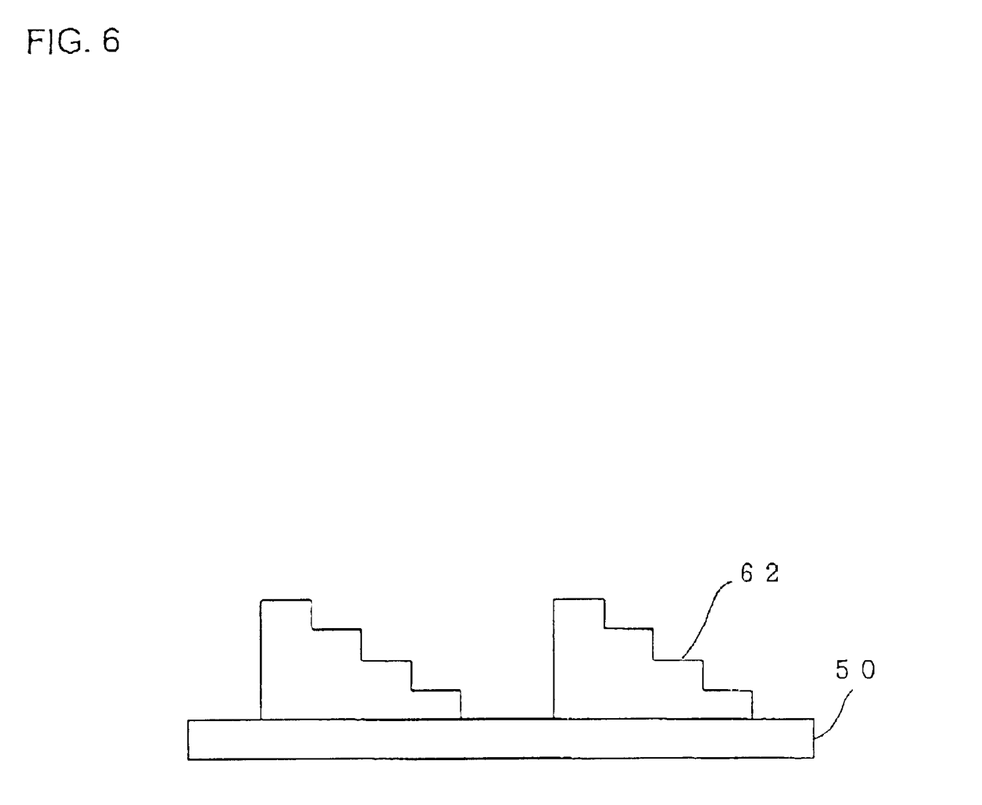
FIG. 6 is an explanatory diagram explaining an example (in the shape of a stair cross section) of a diffraction grating without any "offset portion" manufactured on the substrate pursuant to the present invention.
Figure 8:
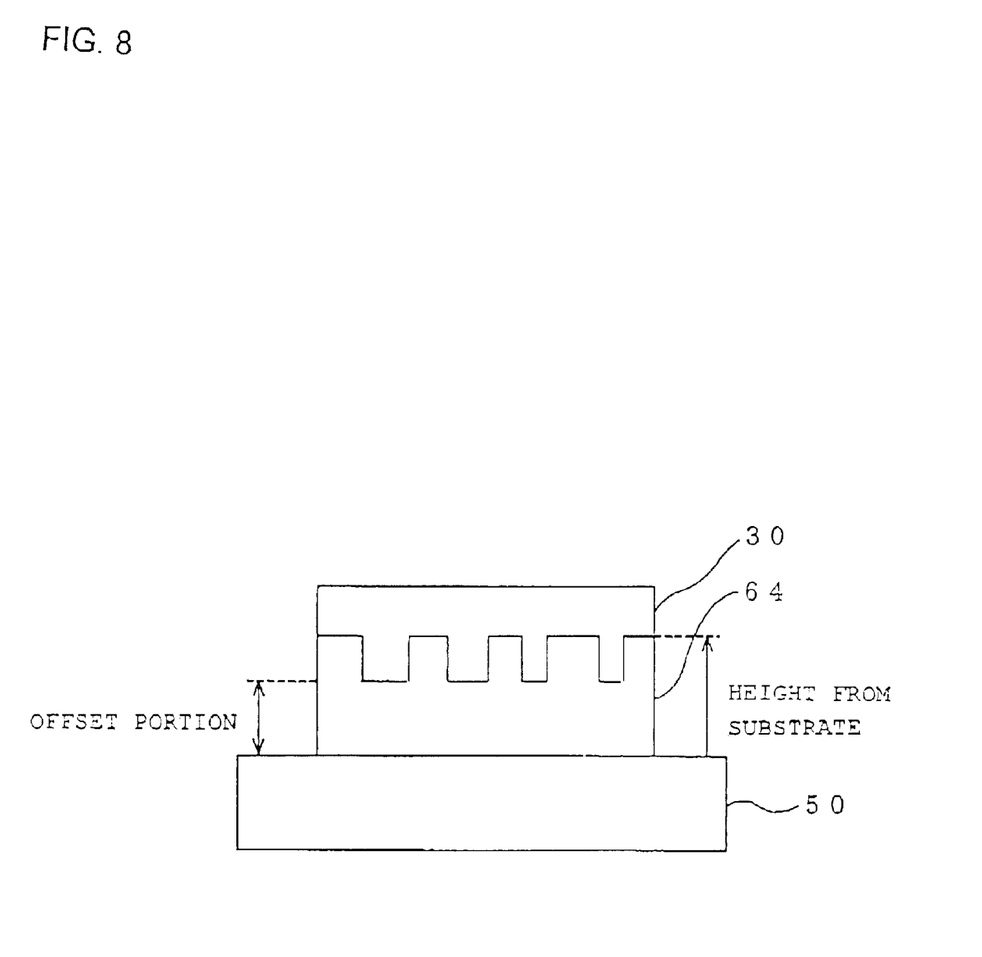
FIG. 8 is an explanatory diagram explaining the manufacture of a substrate pursuant to a conventional manufacturing method.

Nevertheless, when pressing the stamper after applying the resin to the substrate, so-called "offset portion" is formed on the thick section of the film since resin is sandwiched between the concave/convex layers of the substrate and stamper (refer to FIG. 8). Thus, as shown in FIG. 5 or FIG. 6, it is difficult to obtain a shape where an inclination begins immediately from the substrate surface. Moreover, due to the existence of this "offset portion," it is difficult to control the height of the stamper from the substrate surface, and it is difficult to secure the evenness of the resin thickness in the surface and the evenness of contraction. Thus, developed was the MIMIC (micromolding in capillaries) method as the method of forming resin patterns without any "offset portion" (International Publication No: WO97/33737).

SUMMARY OF THE INVENTION

Nevertheless, with the aforementioned MIMIC method, there is a problem in that the resin does not spread widely on the substrate, and the speed thereof is also slow. Further, there is an additional problem in that high-precision pattern forming employing rubber, resin or the like as the stamper material is difficult.

Therefore, an object of the present invention is to provide a manufacturing method of a microstructure capable of infiltrating resin in a wide area on the substrate quickly by providing a barometric pressure difference to one end side and the other end side of the stamper, and forming high-precision resin patterns without any "offset portion" by making the stamper a metal stamper.

Another object of the present invention is to provide a manufacturing device capable of forming resin patterns on a substrate without any "offset portion" described above.

A further object of the present invention is to provide a semiconductor manufacturing device and electro-optical body manufacturing device capable of forming resin patterns without any "offset portion" described above.

In order to achieve the aforementioned objects, with the manufacturing method of a microstructure according to the present invention, a substrate and a stamper to which a concave/convex pattern is formed are aligned so as to be flush; resin is infiltrated from one end side of the stamper to the aligned face of the substrate and stamper, and the resin is drawn into the concave/convex pattern of the stamper by setting the barometric pressure of the other end side of the stamper to be relatively lower than the one end side of the stamper; resin that spread in the concave/convex pattern of the stamper is cured; and a resin pattern transferred from the stamper is obtained on the substrate by separating the substrate and stamper.

With the aforementioned structure, as the resin easily spreads on the substrate, it is possible to expand the area where the resin is to spread on the substrate, secure the evenness of the thickness of the applied resin, and thereby obtain a resin pattern on a substrate without any "offset portion".

Preferably, the relative setting of barometric pressure is conducted by the aspiration from the other end side of the stamper.

Preferably, the relative setting of barometric pressure is conducted by pressurizing one end side of the stamper and depressurizing the other end side thereof.

Preferably, the aforementioned infiltration of resin is conducted by capillary action.

Preferably, the stamper is a thin-film metal stamper of approximately 100 $\mu$m, and cushion material is formed on the non-patterned face side such that the alignment of the substrate and stamper becomes even. By employing a metal stamper as the stamper in the present invention, high-precision pattern forming is possible.

Preferably, the aforementioned resin is thermosetting resin or photocuring resin.

The manufacturing device according to the present invention comprises: pressurizing means for pressing a stamper, to which a concave/convex pattern is formed, against a substrate; barometric pressure difference forming means for providing barometric pressure difference to both sides of the substrate and stamper; and resin supplying means for supplying resin to the side with a relatively higher barometric pressure between both end sides of the stamper.

Preferably, the manufacturing method of a microstructure described above is employed in the manufacture process of LCD display devices, electro-optical devices such as EL display devices, and semiconductor devices.

The manufacturing device according to the present invention comprises: pressurizing means for pressing a stamper, to which a concave/convex pattern is formed, against a substrate; a chamber for covering at least a part of the substrate and stamper; depressurizing means for depressurizing the barometric pressure in the chamber; and resin supplying means for supplying resin to the periphery of the stamper outside the chamber.

Preferably, the aforementioned manufacturing device further comprises pressure intensifying means for intensifying the barometric pressure outside the chamber.

According to the structure described above, the resin infiltrating along the alignment face of the substrate and stamper is easily drawn into (or pushed into) the fine gap between the substrate and stamper, and will sufficiently spread within the concave/convex pattern of the stamper. The infiltration time is also shortened.

Preferably, with the aforementioned manufacturing device, the stamper is formed of a metal thin film with a film thickness of approximately 100 $\mu$m, and a cushion layer is formed on the back face (non-patterned face) thereof.

With the aforementioned structure, the adhesiveness of the stamper and substrate on the overall surface of the substrate will be improved, and the securement of the evenness of thickness of the resin formed as the optical element or the like will be facilitated. Moreover, the processing precision of the patterns will improve as a metal stamper is used.

Further, the aforementioned manufacturing device of a microstructure may be employed in the manufacture of semiconductor elements or electro-optical elements by constituting a part of a semiconductor manufacturing device, or a manufacturing device of electro-optical devices such as liquid crystal display devices, EL (electro-luminescence) devices, organic EL devices, and so on.

DESCRIPTION OF THE PREFERRED EMBODIMENTS

Embodiments of the present invention are now described with reference to the relevant drawings.

Figure 1:
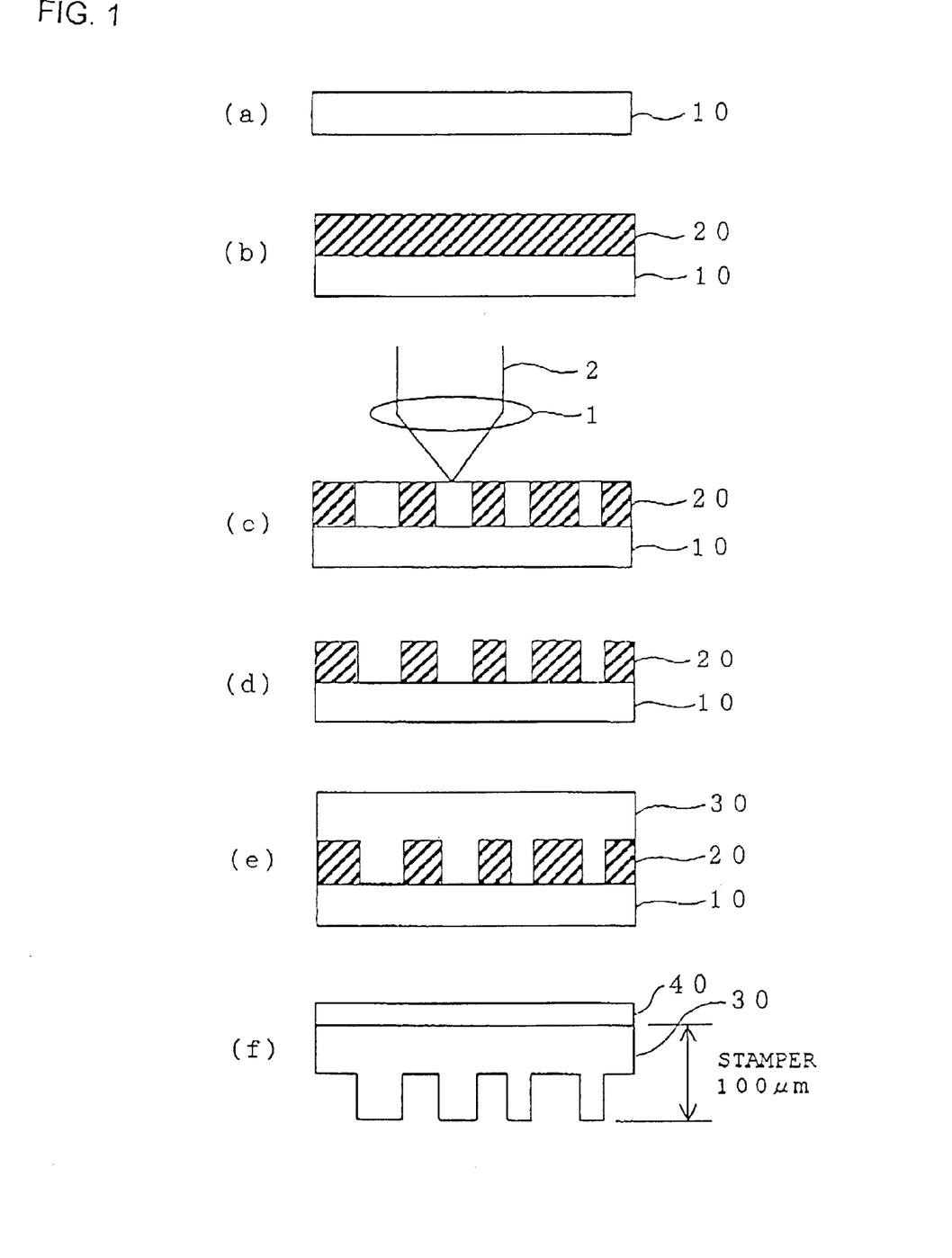
FIG. 1 is a process diagram explaining the manufacturing process of the substrate of the present invention.
Figure 2:
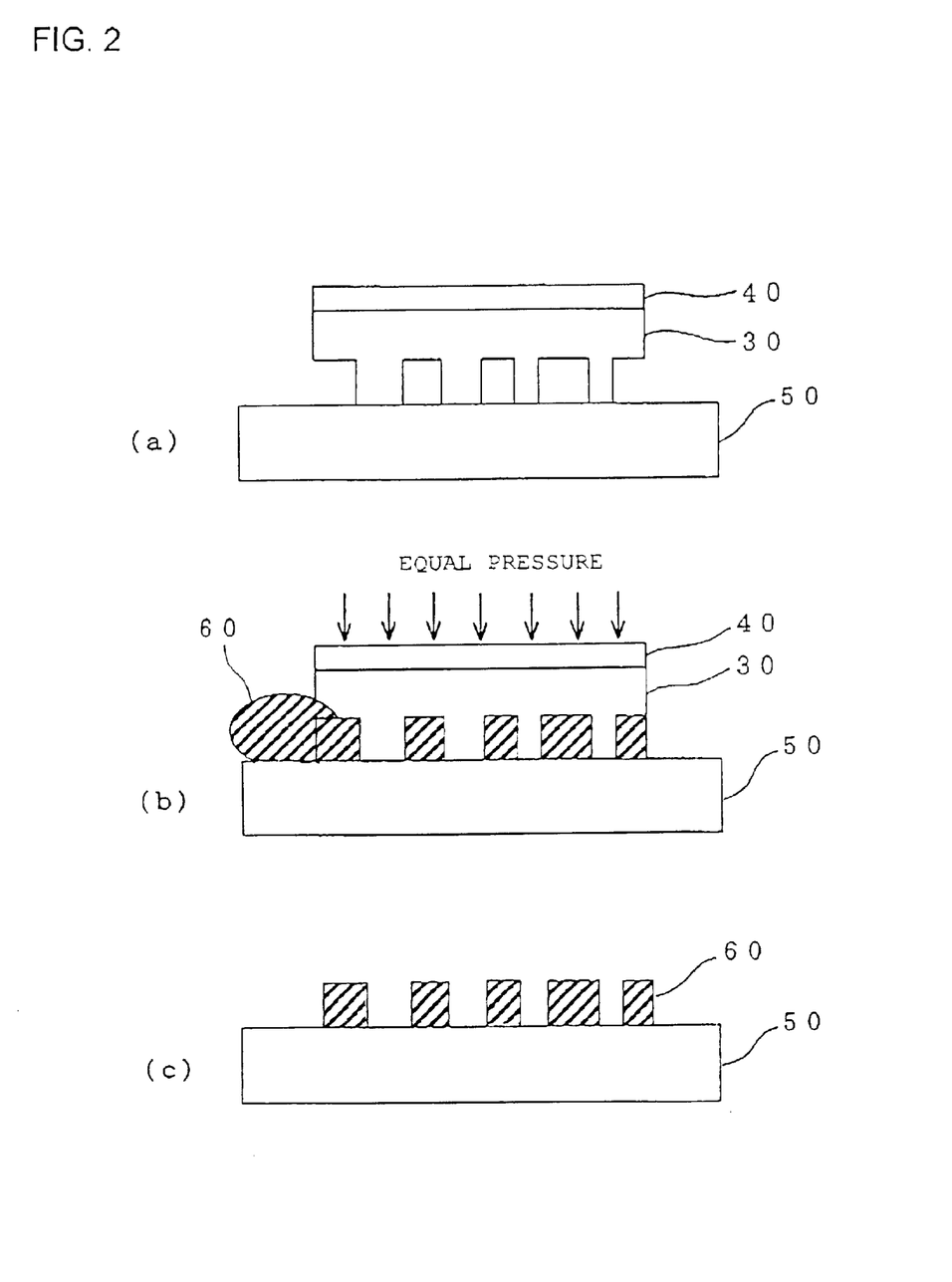
FIG. 2 is a process diagram explaining the manufacturing process of the substrate of the present invention.

FIG. 1 and FIG. 2 are explanatory diagrams for explaining the process of the manufacturing method of the substrate according to the present invention. Foremost, in order to manufacture the stamper, as shown in FIG. 1(a), surface processing is conducted to a glass substrate 10. With this processing, a smooth recordable face is formed on the surface of the glass substrate 10 by precision polishing.

Next, photo-resist velation processing is performed. As shown in FIG. 1(b), a photo-resist film 20 is formed in a prescribed thickness on the glass substrate 10 pursuant to the likes of a spin coating method.

Then, exposure processing for exposing patterns of electro-optical elements or the like on this photo-resist film 20 is performed. As shown in FIG. 1(c), for example, a laser beam 2 modulated with pattern information is converged on the photo-resist film 20 with an objective (condensing) lens 1, the photo-resist is exposed by scanning the photo-resist film 20, and element patterns are recorded thereby. The exposure may also be conducted with a stepper or the like.

Then, a development process is performed to the photo-resist. As shown in FIG. 1(d), the portion of the photo-resist exposed in the previous process is dissolved with a developing solution in order to form a concave/convex pattern.

A conductivity process is performed for forming a conductive film on the concave/convex pattern surface. This conductive film is formed by layering metals such as nickel (Ni) on the surface of a concave/convex pattern with the likes of a sputtering method or electroless method (not shown).

With the conductive film as the electrode, as shown in FIG. 1(e), nickel or the like is layered pursuant to electroforming in order to form a metal layer 30, and a casting mold is prepared thereby. A stamper (metal stamper) 30 prepared as described above is generally formed to have a film thickness of approximately 300 μm, and it is preferable to form the stamper 30 to have a film thickness of approximately 100 μm in order to improve the adhesiveness and evenness with the substrate described later, and to form a cushion material on the back face of such stamper.

In other words, a polishing process is performed to the back face of the stamper 30. The back face (non-patterned face) of the stamper 30 is polished and flattened with the likes of tape polishing. A trimming metal mold of the stamper 30 is prepared in a prescribed form. As shown in FIG. 1(f), cushion material is formed on the back face of the stamper 30. Cushion material may be formed by applying a resin layer 40 having suitable elasticity. The adhesiveness of the substrate described later and the stamper is sought with a thin-film structured stamper 30 and the cushion film 40, and capillary action is thereby further secured.

Figure 4:
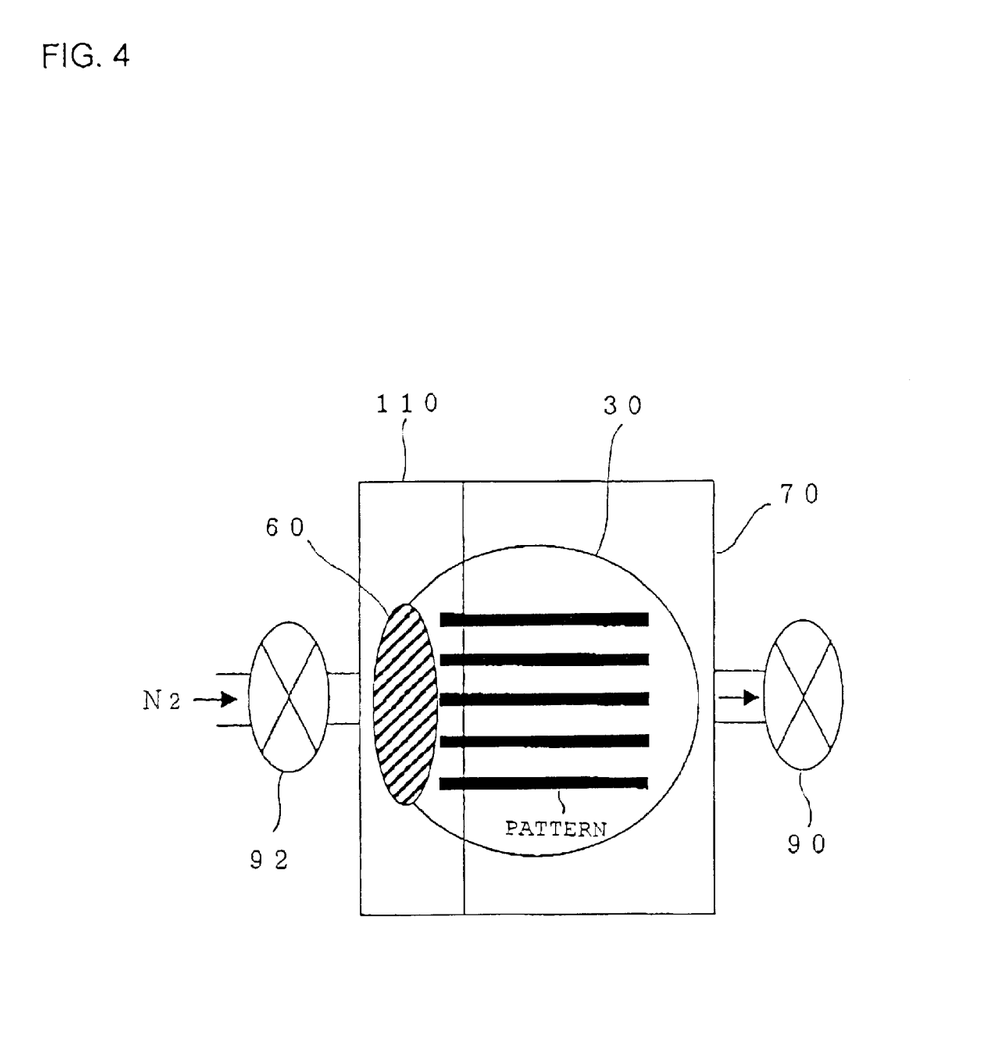
FIG. 4 is an explanatory diagram explaining the drawing of resin into the concave/convex pattern between the substrate and stamper pursuant to the capillary action and barometric pressure difference.

Next, explained is the duplicating process of substrates employing the aforementioned stamper (metal stamper). As shown in FIG. 2(a), the stamper 30 (or a metal mold with the stamper 30 built therein) is pressed against a substrate 50, such as a glass plate, resin plate or circuit board for forming electro-optical elements and the like. The pressing force may be obtained by mounting a pressing plate 80 of a suitable weight. The concave/convex pattern of the stamper 30 is, for example, as shown in FIG. 4, a lattice shape extending from one end of the stamper 30 to the other end thereof.

Figure 3:
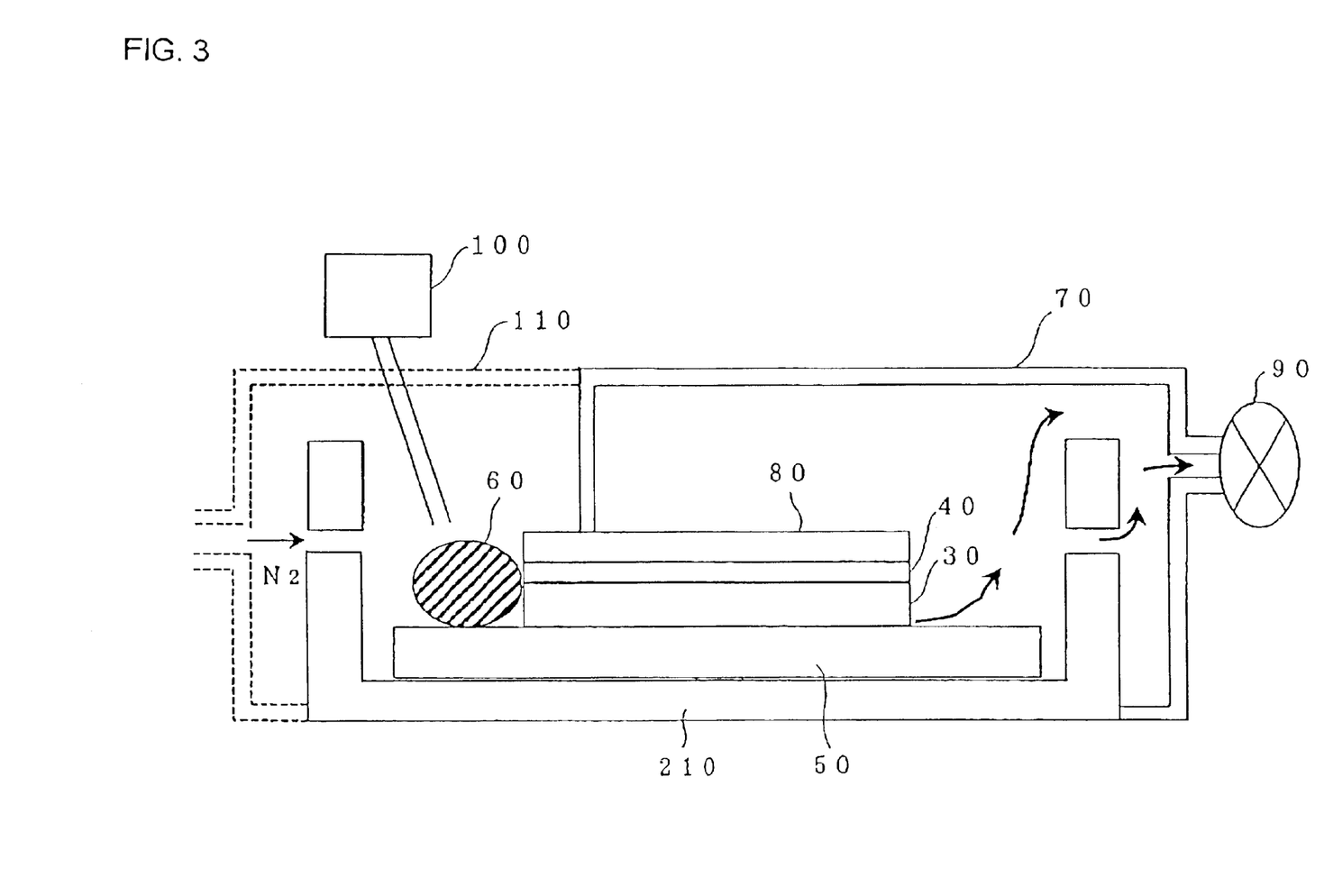
FIG. 3 is an explanatory diagram explaining the manufacturing device of the substrate of the present invention.

As shown in FIG. 2(b) or FIG. 3, photocuring resin 60 is applied to one end of the stamper 30, and is infiltrated in the gap of the concave/convex pattern between the substrate 50 and stamper 30 pursuant to capillary action. The applied resin is spread throughout the entire pattern by vacuuming from the opposite side of the stamper 30. Moreover, where necessary, the supplied resin (applied resin) may be pressurized with inert gas such as nitrogen gas in order to spread along the concave/convex pattern on the substrate pursuant to the pressing from the application side and the vacuuming from the opposite side.

After curing the resin 60 in the concave/convex pattern by exposing the resin with a method such as ultraviolet radiation, the stamper 30 is removed (or separated) from the substrate 50, and, as shown in FIG. 2(c), prepared is a substrate to which a resin pattern is formed. Removal, for example, is enabled by blowing air from the periphery of the alignment face of the stamper and substrate. Further, the resin may also be thermosetting resin, and curing is conducted by heating in such a case.

FIG. 3 is an explanatory diagram explaining an example of a substrate manufacturing device employed in the aforementioned manufacturing process. This substrate manufacturing device may also be structured as a part of a semiconductor manufacturing device or a manufacturing device of electro-optical devices.

In FIG. 3, the substrate 50 is mounted on the lower holder 210, which also retains the stamper 30 (metal mold). A first chamber 70 covers a part of the stamper 30, and the chamber 70 forms a closed space together with the holder 210. Gas in this closed space is discharged with the vacuum pump 90, and the internal pressure of the chamber 70 is relatively lower than the external pressure thereof. Thereby, suction pressure (negative pressure) is formed in the gaps between the substrate 50 and stamper 30. The stamper 30 is pressed against the substrate 50 at an even strength with a flat pressing plate 80 via the cushion material 40. Although this functions as a pressurizing means for pressing the stamper against the substrate, other pressurizing means such as a spring or cylinder may also be used. The thin-film structure of the stamper 30 and the cushion film 40 enables the even adhesion between the substrate 50 and the stamper 30. A resin supplying means 100 for supplying droplets of resin to the periphery of the stamper 30 is provided to the side of the stamper 30 on the outside of the chamber 70.

Furthermore, it is also possible to provide a second chamber 110. The second chamber 110 covers the other portion of the stamper 30 covered with the first chamber 70 and the resin supplying means 100, and forms a second closed space together with the holder 210. Pressurizing gas is supplied inside the second chamber 110 via a pressurizing means 92, such as a pump for pressurizing nitrogen gas or a regulating valve for regulating the gas pressure, from a supply source of inert gas such as nitrogen gas (not shown). Thereby, the resin 60 supplied in droplets to the side end portion of the stamper 30 is pressurized and pressed in between the stamper 30 and substrate 50.

Barometric pressure difference is formed in the first and second chambers pursuant to the discharge by the vacuum pump 90 and the pressurizing means 92, and barometric pressure difference is provided between both sides of the substrate 50 and stamper 30. Resin supplied to the left side of the stamper 30 moves from left to right pursuant to this barometric pressure difference in addition to the capillary action, and spreads in the concave/convex pattern.

As the spreading of resin may be anticipated by this barometric pressure difference, it is possible to conduct only one of the aforementioned depressurization or pressurization steps. Moreover, it is possible to make the structure such that the entire resin supplying means 100 is provided inside the chamber 110.

FIG. 4 is an explanatory diagram for explaining the operation of the substrate manufacturing device shown in FIG. 3. FIG. 4 is a conceptual diagram showing the general view from the top portion. A lattice-shaped concave/convex pattern extending in the leftward and rightward direction is formed on the stamper 30. The resin 60 supplied to one end (left end) of the stamper 30 moves toward the other end (right end) in the gap between the stamper 30 and substrate 50 pursuant to the capillary action and barometric pressure difference. The resin spreads sufficiently in the pattern. Resin is filled in the concave/convex pattern by appropriately setting the resin viscosity, barometric pressure difference, drawing time, and so on.

As described above, with the chamber 70, one end face thereof is vacuumed by depressurization, and, when needed, the other end face is pressurized by nitrogen gas. The barometric pressure difference generated at both ends of the stamper 30 as a result thereof facilitates the infiltration of the applied resin 60 along the concave/convex pattern between the stamper 30 and substrate 50, and the resin spreads evenly across the entire substrate, and a resin pattern is formed on the substrate.

Figure 7:
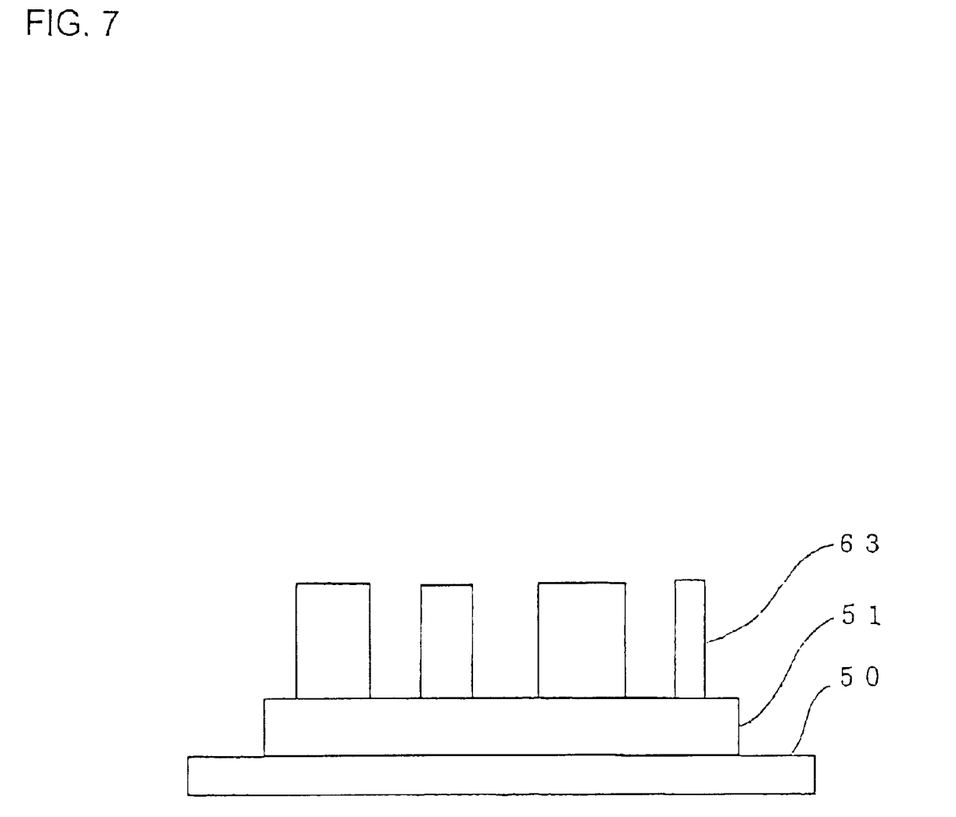
FIG. 7 is an explanatory diagram explaining an example of forming a pattern exposing the substrate surface.

FIGS. 5 to 7 are examples of a diffraction grating having braze effects manufactured with the present invention. A "offset portion" does not exist in the patterns formed in any of the examples.

In FIG. 5, a resin layer 61 structuring a saw blade pattern is formed on the substrate 50, and the bottom portion of each saw blade shape is rising from the surface from the substrate 50.

In FIG. 6, a resin layer 62 structuring a stair pattern is formed on the substrate 50, and each stair shape is rising from the surface of the substrate 50. Moreover, it is also possible to form an area without the resin layer 62.

FIG. 7 is an example of forming a pattern on the conductive film 51 formed on the substrate 50. As a "offset portion" does not exist on the resin layer 63 structuring the pattern, it is possible to expose the conductive film 51 between the patterns and to directly wire the conductive film 51.

According to the embodiments of the present invention as described above, it is possible to draw (spread) the resin in a wide area inside the pattern of the stamper by supplying resin to one side of the stamper and vacuuming it from the opposite side of such stamper.

Further, it is possible to spread the resin in the pattern of the stamper by adding pressure to the resin from one side of the stamper.

Moreover, it is possible to spread the resin in a wide area of the pattern of the stamper by combining the aforementioned vacuum and pressurization.

In addition, as resin is aggressively sucked in (or pressurized), resin filling is completed in a shorter time in comparison to filling resin in the stamper pattern with only capillary action.

Furthermore, the patterns do not easily come apart as a metal stamper is used as the stamper in the present invention.

Moreover, by making the thickness of the stamper thin and disposing cushion material on the back face thereof, the substrate and stamper adhere at an even pressure, and the adhesion and evenness of the film thickness are improved thereby.

As it is possible to form elements without any "offset portion," this is preferable in manufacturing elements and panels that reflect, in a specific direction, the light of light (irradiation) reflectors of diffraction gratings and LCD panels.

Since patterns without any "offset portion" may be formed, as shown in FIG. 7, it is possible to form a pattern film capable of contacting the conductive film and which opens above such conductive film.

Further, although the aforementioned embodiments were explained where the photo-resist process is of a positive type, a negative type process will also yield the same advantages.

Moreover, although the resin was infiltrated in one direction in the aforementioned embodiments, it would be possible to provide a gas vent to a portion of the stamper, apply resin to the periphery of the stamper, blow inert gas from the periphery thereof, and make the resin move toward the center of the stamper.

As described above, with the manufacturing method and manufacturing device of the substrate according to the present invention, it is possible to draw the resin in a wide area in the gap between the substrate and stamper upon duplicating the stamper pattern on the substrate. It is further possible to sufficiently spread the resin even in a comparatively large pattern, and the infiltration time of such resin is shortened thereby. Moreover, a high-precision resin pattern without any "offset portion" may be formed on the substrate.

The entire disclosure of Japanese Patent Application No. 2000-284988 filed Sep. 20, 2000 is incorporated herein by reference.

What is claimed is:

1. A manufacturing method of a microstructure comprising:

aligning a substrate and a stamper to which a concave/convex pattern is formed to be flush inside a chamber;

infiltrating a resin from outside said chamber to one end side of said stamper to said aligned face of said substrate and said stamper, and drawing said resin into the concave/convex pattern of said stamper by setting the barometric pressure of the other end side of said stamper to be relatively lower than said one end side of said stamper; and curing said resin that spread in the concave/convex pattern of said stamper; and obtaining a resin pattern that is transferred from said stamper onto said substrate by separating said substrate and said stamper.

2. A manufacturing method of a microstructure according to claim 1, wherein said relative setting of barometric pressure is conducted by the aspiration from the other end side of said stamper.

3. A manufacturing method of a microstructure according to claim 1, wherein said relative setting of barometric pressure is conducted by pressurizing one end side of said stamper and depressurizing the other end side of said stamper.

4. A manufacturing method of a microstructure according to claim 1, wherein the infiltration of said resin is conducted by capillary action.

5. A manufacturing method of a microstructure according to claim 1, wherein said stamper is a thin-film metal stamper, and cushion material is formed on the non-patterned face side such that the alignment of said substrate and said stamper becomes even.

6. A manufacturing method of a microstructure according to claim 1, wherein a concave/convex pattern is formed on the patterned face of said stamper and cushion material is formed on the non-patterned face thereof.

7. A manufacturing method of a microstructure according to claim 1, wherein said resin is thermosetting resin or photocuring resin.

8. A manufacturing device, comprising:

a chamber having pressurizing means for pressing a stamper, to which a concave/convex pattern is formed, against a substrate; and barometric pressure difference forming means for providing barometric pressure difference to both sides of said substrate and said stamper; and resin supplying means outside said chamber for supplying resin to the side with a relatively high barometric pressure between both end sides of said stamper.

9. A manufacturing device according to claim 8, wherein said stamper is a thin-film metal stamper.

10. A manufacturing device according to claim 8, further comprising a cushion material standing between said stamper and said pressurizing means for evenly pressing said stamper against said substrate.

11. A manufacturing device according to claim 8, wherein said manufacturing device is a semiconductor manufacturing device.

12. A manufacturing device according to claim 8, wherein said manufacturing device is a manufacturing device of electro-optical devices.

13. A manufacturing device, comprising:

pressurizing means for pressing a stamper, to which a concave/convex pattern is formed, against a substrate;

a chamber for covering a part of said substrate and said stamper;

depressurizing means for depressurizing the barometric pressure in said chamber; and resin supplying means for supplying resin to the periphery of said stamper outside said chamber.

14. A manufacturing device according to claim 13, further comprising pressure intensifying means for intensifying the barometric pressure outside said chamber.

15. A manufacturing device according to claim 13, wherein said stamper is a thin-film metal stamper.

16. A manufacturing device according to claim 13, further comprising a cushion material standing between said stamper and said pressurizing means for evenly pressing said stamper against said substrate.

17. A manufacturing device according to claim 13, wherein said manufacturing device is a semiconductor manufacturing device.

18. A manufacturing device according to claim 13, wherein said manufacturing device is a manufacturing device of electro-optical devices.

* * * * *